US009627397B2

(12) United States Patent
Lai et al.

(10) Patent No.: US 9,627,397 B2
(45) Date of Patent: Apr. 18, 2017

(54) MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/803,212

(22) Filed: Jul. 20, 2015

(65) Prior Publication Data
US 2017/0025428 A1    Jan. 26, 2017

(51) Int. Cl.
| | |
|---|---|
| H01L 27/00 | (2006.01) |
| H01L 27/11556 | (2017.01) |
| H01L 21/768 | (2006.01) |
| H01L 21/28 | (2006.01) |
| H01L 27/11582 | (2017.01) |
| H01L 29/788 | (2006.01) |
| H01L 29/51 | (2006.01) |
| H01L 29/06 | (2006.01) |

(Continued)

(52) U.S. Cl.
CPC .. *H01L 27/11556* (2013.01); *H01L 21/28273* (2013.01); *H01L 21/28282* (2013.01); *H01L 21/76897* (2013.01); *H01L 23/535* (2013.01); *H01L 27/11582* (2013.01); *H01L 29/0649* (2013.01); *H01L 29/513* (2013.01); *H01L 29/518* (2013.01); *H01L 29/7883* (2013.01); *H01L 27/115* (2013.01)

(58) Field of Classification Search
CPC ................................. H01L 27/11556
See application file for complete search history.

(56) References Cited

U.S. PATENT DOCUMENTS

| | | | |
|---|---|---|---|
| 6,559,008 | B2 | 5/2003 | Rabkin et al. |
| 9,178,077 | B2 | 11/2015 | Davis et al. |

(Continued)

FOREIGN PATENT DOCUMENTS

| | | |
|---|---|---|
| TW | 201238033 A1 | 9/2012 |
| TW | 201428895 A | 7/2014 |

OTHER PUBLICATIONS

TIPO Office Action dated Sep. 29, 2016 in Taiwan application (No. 104124177).

*Primary Examiner* — William Harriston
(74) *Attorney, Agent, or Firm* — McClure, Qualey & Rodack, LLP

(57) ABSTRACT

A memory device includes a semiconductor substrate, an isolation layer disposed on the semiconductor substrate, a first conductive layer disposed on the isolation layer, at least one contact plug passing through the isolation layer and electrically contacting the semiconductor substrate with the first conductive layer, a plurality of insulating layers disposed on the first conductive layer, a plurality of second conductive layers alternatively stacked with the insulating layers and insulated from the first conductive layer, a channel layer disposed on at least one sidewall of a first through opening and electrically contacting to the contact plug, wherein the first through opening passes through the insulating layers and the second conductive layers to expose the contact plug, and a memory layer disposed between the channel layer and the second conductive layers.

14 Claims, 13 Drawing Sheets

(51) Int. Cl.
*H01L 23/535* (2006.01)
*H01L 27/115* (2017.01)

(56) References Cited

U.S. PATENT DOCUMENTS

| | | |
|---|---|---|
| 9,362,302 B1 * | 6/2016 | Lai .................... H01L 27/11582 |
| 2011/0002178 A1 | 1/2011 | Hwang et al. |
| 2011/0032772 A1 | 2/2011 | Aritome |
| 2015/0200203 A1 * | 7/2015 | Jang .................. H01L 27/11582 257/324 |
| 2016/0204115 A1 * | 7/2016 | Ko ..................... H01L 27/11582 257/329 |

* cited by examiner

MEMORY DEVICE AND METHOD FOR FABRICATING THE SAME

BACKGROUND

Technical Field

The disclosure of the present invention generally relates to a non-volatile memory (NVM) device and the method for fabricating the same, and more particularly to a vertical channel memory and the method for fabricating the same.

Description of the Related Art

An NVM device which is able to continually store information even when the supply of electricity is removed from the device containing the NVM cell has been widespreadly adopted by bulk solid state memory applications in the art.

The method for fabricating an NVM device having a vertical channel, such as a vertical channel NAND flash memory device, generally includes steps as follows: A multilayers stack configured by a plurality of insulating layers and a plurality of poly-silicon layers alternatively stacked with each other is firstly provided on a semiconductor substrate. At least one through hole or trench is then formed in the multilayers stack, and a memory layer with silicon-oxide-nitric-oxide-silicon (SONOS) structure and a poly-silicon channel layer are formed in sequence on the sidewalls of the through hole/trench, whereby a plurality of memory cells are defined at the intersection points formed by the SONOS memory layer, the channel layer and the poly-silicon layers; and the memory cells are electrically connected to the semiconductor substrate that can serve as a bottom common source line for performing a block erase operation of the NVM device through the channel layer.

However, since the traditional bottom common source line is typically a doped region with rather high resistance formed in the semiconductor substrate, and parasitic junction may occur between the doping region and the semiconductor substrate, thus the power consumption may be increased, and the program/read operation reliability and device speed may be deteriorated by signal interference and RC delay due to the parasitic junction capacitance.

Therefore, there is a need of providing a memory device and the method for fabricating the same to obviate the drawbacks encountered from the prior art.

SUMMARY

One aspect of the present invention is to provide a memory device, wherein the memory device includes a semiconductor substrate, a dielectric isolation layer, a first conductive layer, a contact plug, a plurality insulating layers, a plurality of second conductive layers, a channel layer and a memory layer. The isolation layer is disposed on the semiconductor substrate. The first conductive layer is disposed on the isolation layer. The contact plug passes through the isolation layer and electrically contacts the semiconductor substrate with the first conductive layer. The insulating layers are disposed on the first conductive layer. The second conductive layers are alternatively stacked with the insulating layers and insulated from the first conductive layer. The channel layer is disposed on at least one sidewall of at least one first through opening and electrically contacts to the contact plug, wherein the first through opening passes through the insulating layers and the second conductive layers, so as to expose the contact plug. The memory layer disposed between the channel layer and the second conductive layers.

In accordance with another aspect of the present invention, a method for fabricating a memory device is provided, wherein the method includes steps as follows: Firstly, an insulation layer is formed on a semiconductor substrate, and a first conductive layer is then formed on the isolation layer. Next, a multilayers stack having a plurality of insulating layers and a plurality of sacrificing layers stacked with each other is provided on the first conductive layer, to make the first conductive layer isolated from the sacrificing layers. At least one first through opening passing through the multilayers stack, the first conductive layer and the isolation layer is then formed to partially expose the semiconductor substrate the insulating layers and the sacrificing layers. Subsequently, a selective deposition is performed to form a contact plug at the bottom of the first through opening, so as to make the contact plug electrically contacting the semiconductor substrate with the first conductive layer. A memory layer and a channel layer are formed in sequence at least one sidewall of the first through opening to make the memory layer disposed between the channel layer and the remaining sacrificing layers and make the channel layer electrically in contact with the contact plug. Next at least one second through opening passing through the multilayers stack is formed to partially expose the first conductive layer, the insulating layers and the remaining sacrificing layers. The remaining sacrificing layers are then removed through the second through opening. Subsequently, a plurality of second conductive layers are formed on the positions where the remaining sacrificing layers initially occupied.

In accordance with yet another aspect of the present invention, a method for fabricating a memory device is provided, wherein the method includes steps as follows: Firstly, a first insulation layer, a first conductive layer and a second isolation layer are formed in sequence on a semiconductor substrate. At least one contact opening passing through the second isolation layer, the first conductive layer and the first isolation layer is then formed to expose a portion of the semiconductor substrate. Next, a contact plug is formed in the contact opening to electrically contact the semiconductor substrate with the first conductive layer. A multilayers stack having a plurality of insulating layers and a plurality of sacrificing layers stacked with each other is provided on the second isolation layer. At least one first through opening passing through the multilayers stack is then formed to partially expose the contact plug, the insulating layers and the sacrificing layers. A memory layer and a channel layer are formed in sequence on at least one sidewall of the first through opening to make the memory layer disposed between the channel and the remaining sacrificing layers and make the channel layer electrically in contact with the contact plug. Next at least one second through opening passing through the multilayers stack and the second isolation layer is formed to partially expose the first conductive layer, the insulating layers and the remaining sacrificing layers. The remaining sacrificing layers are then removed through the second through opening. Subsequently, a plurality of second conductive layers are formed on the positions wherein the remaining sacrificing layers initially occupied.

In accordance with the aforementioned embodiments of the present invention, a memory device and method for fabricating the same are provided, wherein an isolation layer, a conductive layer and a multilayers stack having a plurality of memory cells defined therein are formed in sequence on a semiconductor substrate; at least one contact plug passing through the isolation layer and the conductive layer is formed to electrically contact the semiconductor substrate with the conductive layer; and a plurality of channel layers vertically passing through the multilayers stack and electrically in contact with the corresponding contact plugs are then provided to electrically connect the memory cells to form a plurality of memory cell strings. Wherein the distance between the conductive layer and the channel layer is substantially shorter than the distance between the semiconductor substrate and the channel layer.

Because the memory device provided by the embodiments of the present invention applies the independent conductive layer to serve as the bottom common source line, instead of using the semiconductor substrate to serve as the bottom common source line, as the prior art memory device does. The current path for performing the read/program operation of the present memory device passing through the conductive layer is shorter than that of the prior art memory device passing through the semiconductor substrate, the operation resistance of the present memory device can be thus significantly reduced. In addition, since there is no doped region with different conductivities formed in the conductive layer of the present memory device, thus the problems of signal interference due to the parasitic junction capacitance formed in the bottom common source line and substrate can be avoided, and the operation reliability and device speed of the memory device can be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
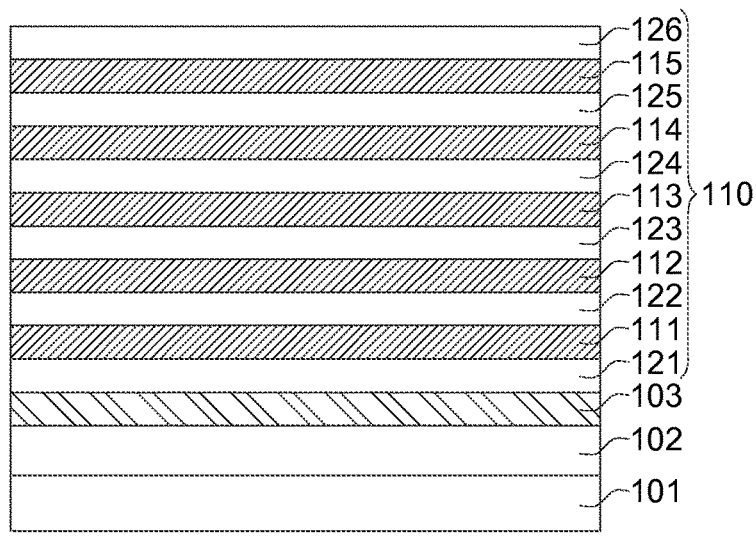
FIGS. 1A to 1J are cross-sectional views illustrating the processing structures for forming a memory device in accordance with one embodiment of the present invention.

The embodiments as illustrated below provide a memory device and the method for fabricating the same to solve the problems of operation reliability due to the signal interference of the parasitic junction capacitance formed in the bottom common source line and bottom substrate. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1J are cross-sectional views illustrating the processing structures for forming a memory device 100 in accordance with one embodiment of the present invention. In the present embodiment, the memory device 100 is a vertical channel flash memory device. The method for fabricating the memory device 100 includes steps as follows:

Firstly, an isolation layer 102 is formed on a semiconductor substrate 101; a first conductive layer 103 is then formed on the isolation layer 102; and a multilayers stack 110 is provided on the first conductive layer 103 (see FIG. 1A). In some embodiments of the present invention, the semiconductor substrate 101 may be made of a p-type doped, n-type doped or undoped semiconductor material, such as poly-silicon, germanium (Ge) or any other suitable semiconductor material. The isolation layer 102 may be made of dielectric material, such as silicon oxide, silicon nitride (SiN), silicon oxynitride (SiON), silicate or the arbitrary combinations thereof. The first conductive layer 103 may be made of conductive material, such as poly-silicon, doped semiconductor material, metal or the arbitrary combinations thereof. In the present embodiment, the semiconductor substrate 101 is made of p-type doped poly-silicon; the isolation layer 102 is made of silicon oxide; and the first conductive layer 103 is made of n-type doped poly-silicon.

The multilayers stack 110 includes a plurality of insulating layers 121-126 and a plurality of sacrificing layers 111-115 formed on the first conductive layer 103. The insulating layers 121-126 and the sacrificing layers 111-115 are parallel to each other and alternatively stacked on the first conductive layer 103 along the Z axle as shown in FIG. 1A. In the present embodiment, the insulating layer 121 and the insulating layer 126 respectively serve as the bottom-most layer and the top-most layer of the multilayers stack 110, wherein the insulating layer 121 is directly in contact with the first conductive layer 103 and electrically isolates the first conductive layer 103 from the sacrificing layers 111-115. In some embodiments of the present invention, the isolation layer 102 preferably has a thickness substantially greater than that of the insulating layers 121-126. In the present embodiment, the thickness of the isolation layer 102 may range from 200 Å (Angstrom) to 1500 Å, and preferably is about 500 Å

The sacrificing layers 111-115 may be made of silicon-nitride compounds, such as SiN, SiON, silicon carbonitride (SiCN), or the arbitrary combinations thereof. In the present embodiment, the sacrificing layers 111-115 are made of SiN. The insulating layers 121-126 may be made of dielectric material, such as silicon oxide, SiN, SiON, silicate or the arbitrary combinations thereof. However, it should be appreciated that, in the embodiments of the present invention, the sacrificing layers 111-116 and the insulating layers 121-127 are made of different material. In the present embodiment, the insulating layers 121-127 are made of silicon oxide. In some embodiments of the present invention, the sacrificing layers 111-116 and the insulating layers 121-127 can be formed by low pressure chemical vapor deposition (LP-CVD).

Figure 1B:
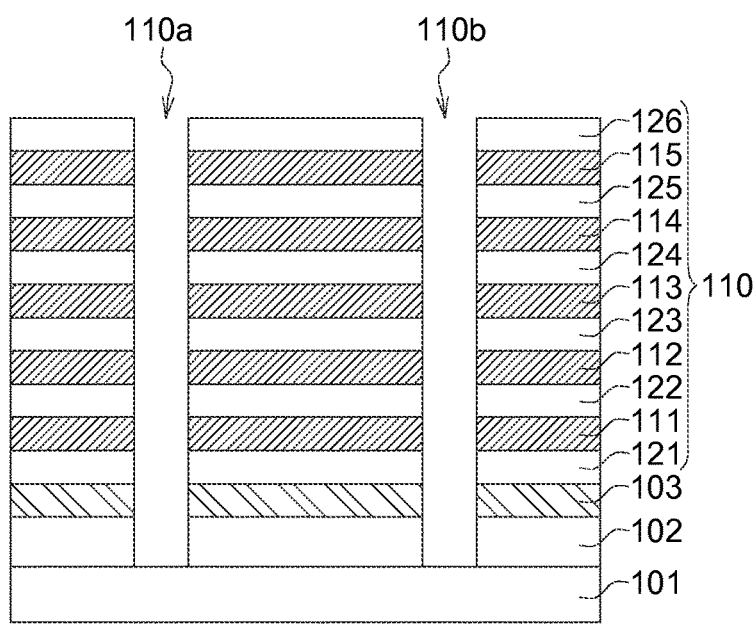

Next, an etching process is performed to form a plurality of first through openings 110*a* and 110*b* passing through the multilayers stack 110, the first conductive layer 103 and the isolation layer 102, so as to expose a portion of the semiconductor substrate 101 (see FIG. 1B). In some embodiments of the present invention, the etching process can be an anisotropic etching process, such as a reactive ion etching (RIE) process, performed on the multilayers stack 110 using a patterned hard mask layer as an etching mask. The first through openings 110a and 110b may be a plurality of circular through holes passing through the multilayers stack 110, the first conductive layer 103 and the isolation layer 102 along the Z axle used to expose a portion of the semiconductor substrate 101 serving as the bottom of the through openings 110a and 110b and used to expose portions of the sacrificing layers 111-115, the insulating layers 121-126, the first conductive layer 103 and the isolation layer 102 serving as the sidewalls of the first through openings 110a and 110b.

Figure 1C:
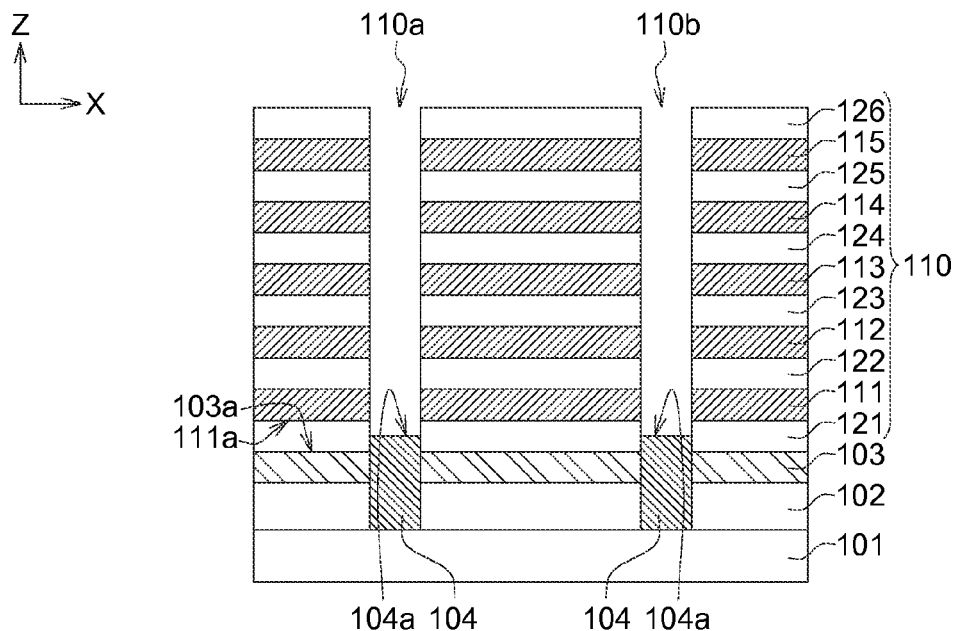

A selective deposition process is then performed to form a plurality of contact plugs 104 respectively disposed on one bottom of the first through openings 110a and 110b, so as to electrically contact the semiconductor substrate 101 with the first conductive layer 103 (see FIG. 1C). In some embodiments of the present invention, the contact plugs 104 can be poly-silicon plugs formed by an atomic layer chemical vapor deposition (ALCVD), monocrystalline silicon/poly-silicon layers formed by selective epitaxial growth (SEG) or the combination thereof.

In order to eliminate the voids formed in the contact plugs 104, the contact plugs 104 may be subjected to an anneal process, and another selective deposition process may be performed to compensate the shrinkage of the contact plugs 104 due to the anneal process. In the present embodiment, the contact plugs 104, measured from the bottom surface of the semiconductor substrate 101, may be higher than the first conductive layer 103 and lower than the sacrificing layers 111-115. In detail, the contact plugs 104 may have a top surface 104a substantially higher than the top surface 103a of the first conductive layer 103 and lower than the bottommost surface 111a of the sacrificing layer 111. However, it should be appreciated that the arrangements of the contact plugs 104, the first conductive layer 103 and the sacrificing layers 111-115 are not limited in this respect.

Figure 1D:
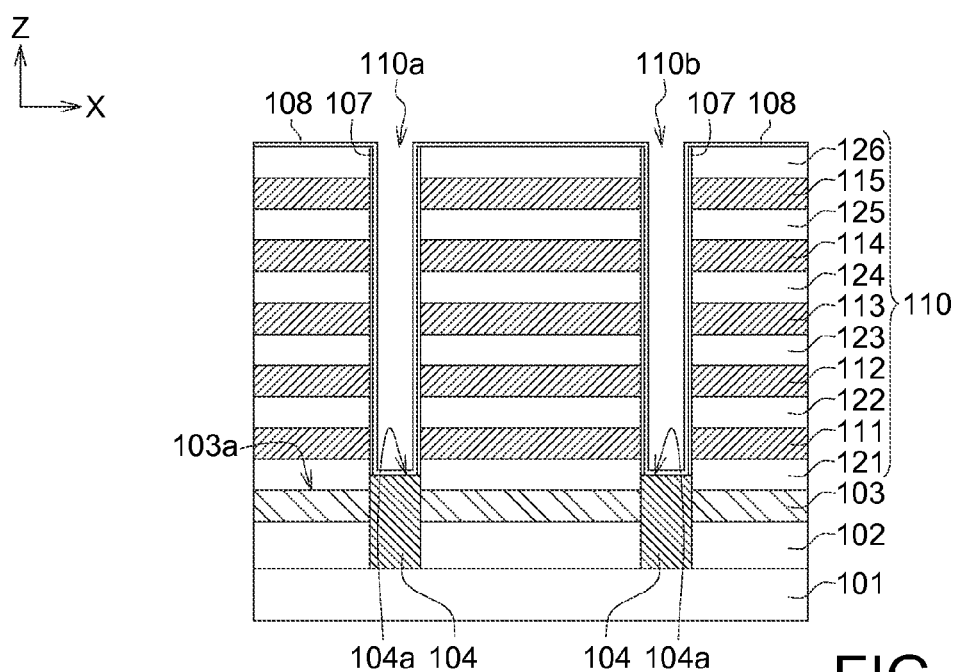
Figure 1E:
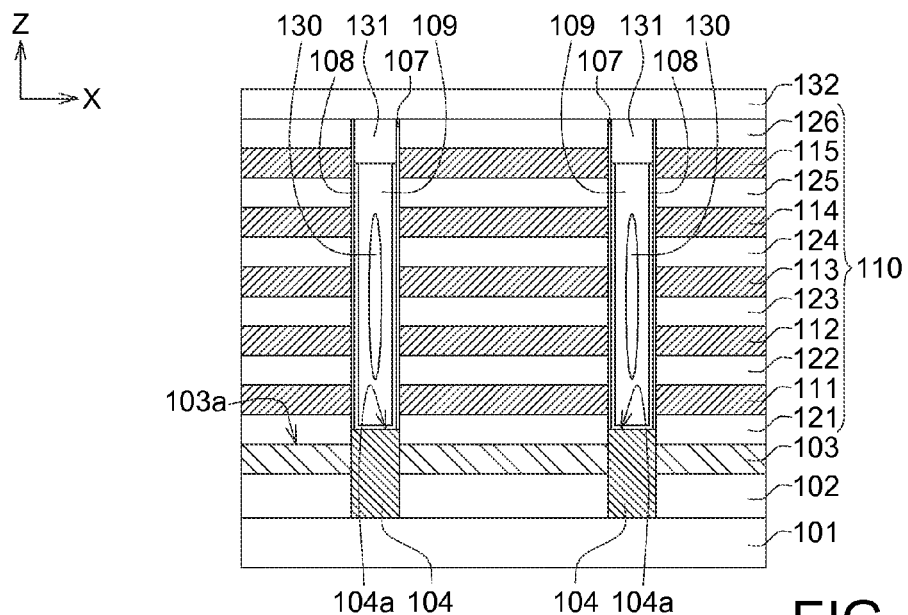

Next, a memory layer 107 and a channel layer 108 are formed in sequence on sidewalls of the first through opening 110a and 110b to make the memory layer 107 disposed between the channel layer 108 and the remaining sacrificing layers 111-115 and make the channel layer 108 electrically in contact with the top surface 104a of the contact plugs 104 (see FIG. 1D). In some embodiments of the present invention, the forming of the memory layer 107 includes steps as follows: a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure is firstly formed to conformally blanket over the multilayers stack 110, the sidewalls and the bottoms of the first through openings 110a and 110b. An etching process id then performed to remove portions of the composite layer having ONO, ONONO or ONONONO structure disposed on the top surface of the multilayers stack 110 and the bottoms of the first through opening 110a and 110b, so as to expose portions of the top surface 104a of the contact plugs 104.

Thereafter, a deposition process is performed to form the channel layer 108 made of semiconductor material, such as such as silicon (Si), Ge or other doped/undoped semiconductor material, is formed to blanket over the memory layer 107 and the exposed portions of the top surface 104a of the contact plugs 104. In the present embodiment, the channel layer 108 is made of undoped poly-silicon.

After the forming of the channel layer 108, the first through openings 110a and 110b are filled by a dielectric material 109, such as silicon dioxide ($SiO_2$), and at least one air gap 130 is formed in the filled first through openings 110a and 110b. After the dielectric material 109 is etched back, a bond pad 131 may be formed on the dielectric material 109 to form an electrical contact with the channel layer 108, and a clapping layer 132 is then provide to cover the bond pad 131 and the multilayers stack 110 (see FIG. 1E). In the present embodiment, the clapping layer 132 includes silicon oxide.

Figure 1F:
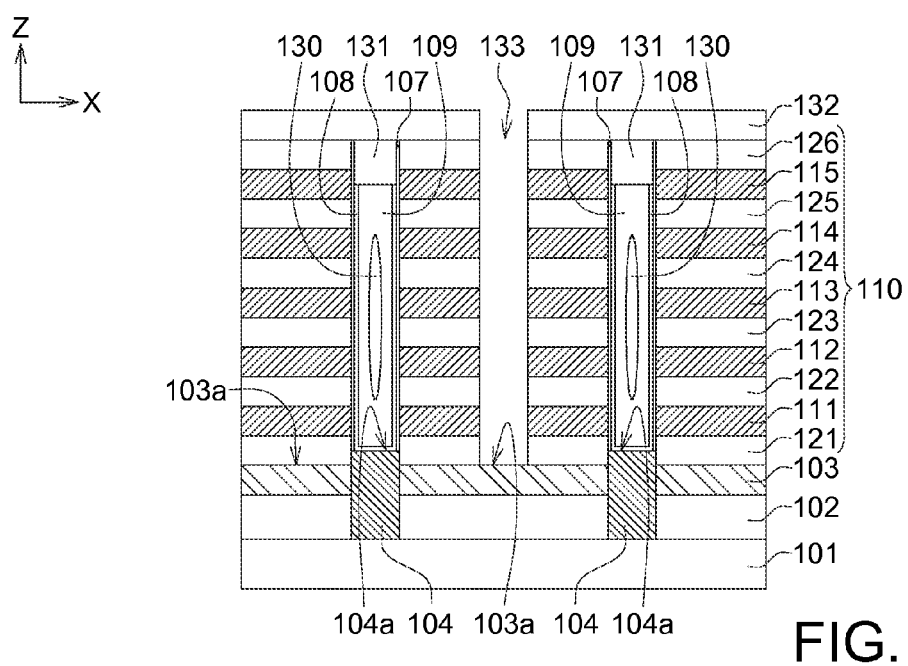
Figure 1G:
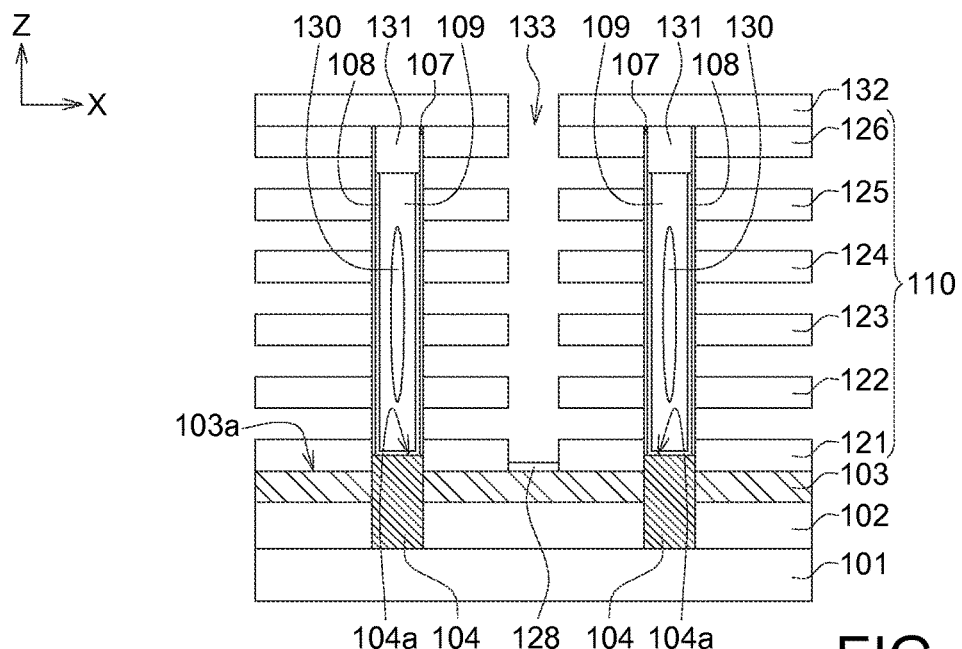
Figure 1H:
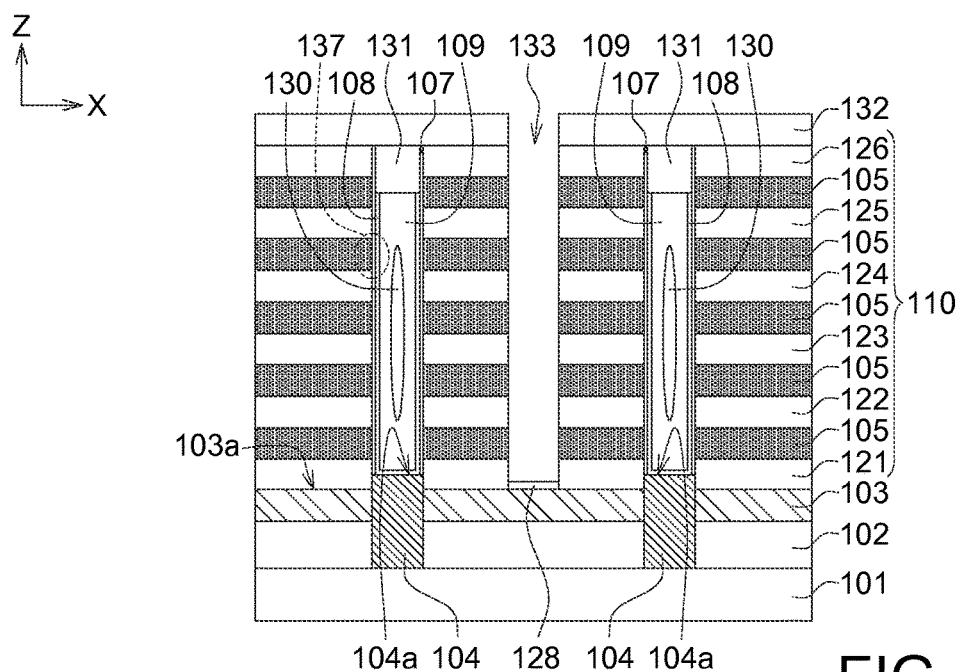

Subsequently, another etching process is performed to form at least one second through opening 133 passing through the multilayers stack 110 along the Z axle from the top surface of the multilayers stack 110, so as to partially expose the sacrificing layers 111-115, the insulating layers 121-126 and the top surface 103a of the first conductive layer 103 (see FIG. 1F).

The remaining sacrificing layers 111-115 is then removed. In the present embodiment, phosphoric acid ($H_3PO_4$) solution is utilized to remove the remaining sacrificing layers 111-115 through the second through opening 133, so as to expose the portions of the memory layer 107 (see FIG. 1G). In some embodiments of the present invention, for the purpose of protecting the first conductive layer 103, a protection layer 128 may be preferably formed on the exposed top surface 103a of the first conductive layer 103 prior to removing the remaining sacrificing layers 111-115. In the present embodiment, the protection layer 128 is a silicon oxide hard mask made by an oxidation process performed on the exposed top surface 103a and used to protect layer 103 in the following process steps.

Next, a plurality of second conductive layers 105 are formed on the positions where the remaining sacrificing layers 111-115 initially occupied. As a result, a plurality of memory cells 137 can be defined at the points of intersection between the second conductive layers 105, the memory layer 107 and the channel layer 108, so as to form a memory cell array in the multilayers stack 110 (see FIG. 1H). In some embodiments of the present invention, the second conductive layers 105 may be made by poly-silicon, metal or other suitable conductive material. In the present embodiment, the second conductive layers 105 are metal layers, such as TiN/W, TaN/W, TaN/Cu and so on.

Figure 1I:
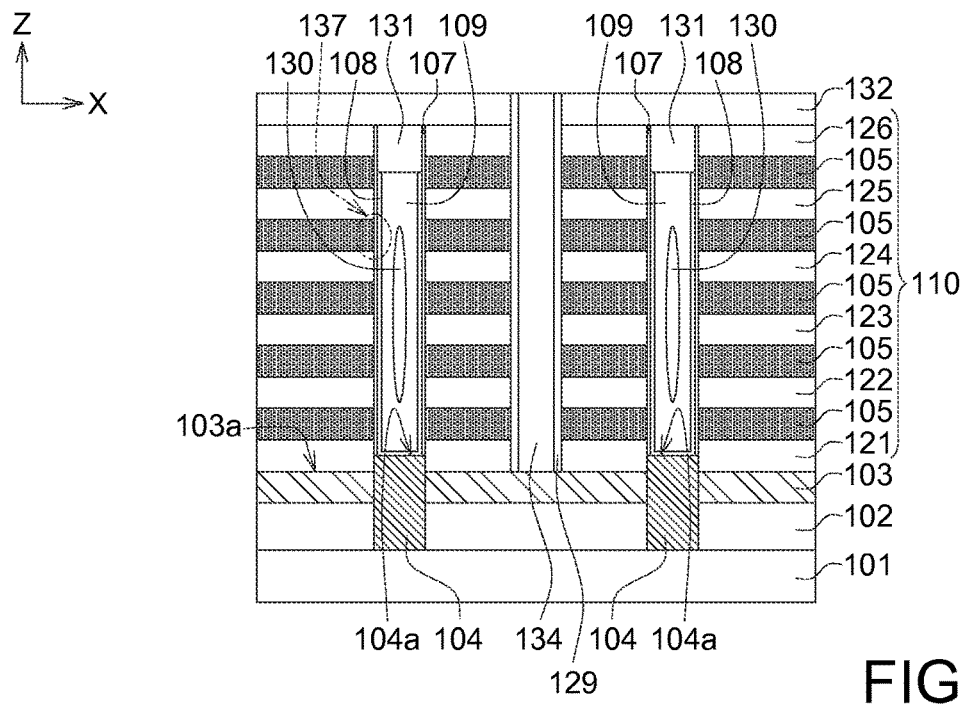

After the forming of the second conductive layers 105, the protection layer 128 is removed; a dielectric spacer 129 is then formed on the sidewalls of the second through opening 133; and a metal plug 134 is formed in the second through opening 133, whereby the metal plug 134 is electrically contact to the first conductive layer 103 and electrically insulated from the second conductive layers 105 by the dielectric spacer 129 (see FIG. 1I).

Figure 1J:
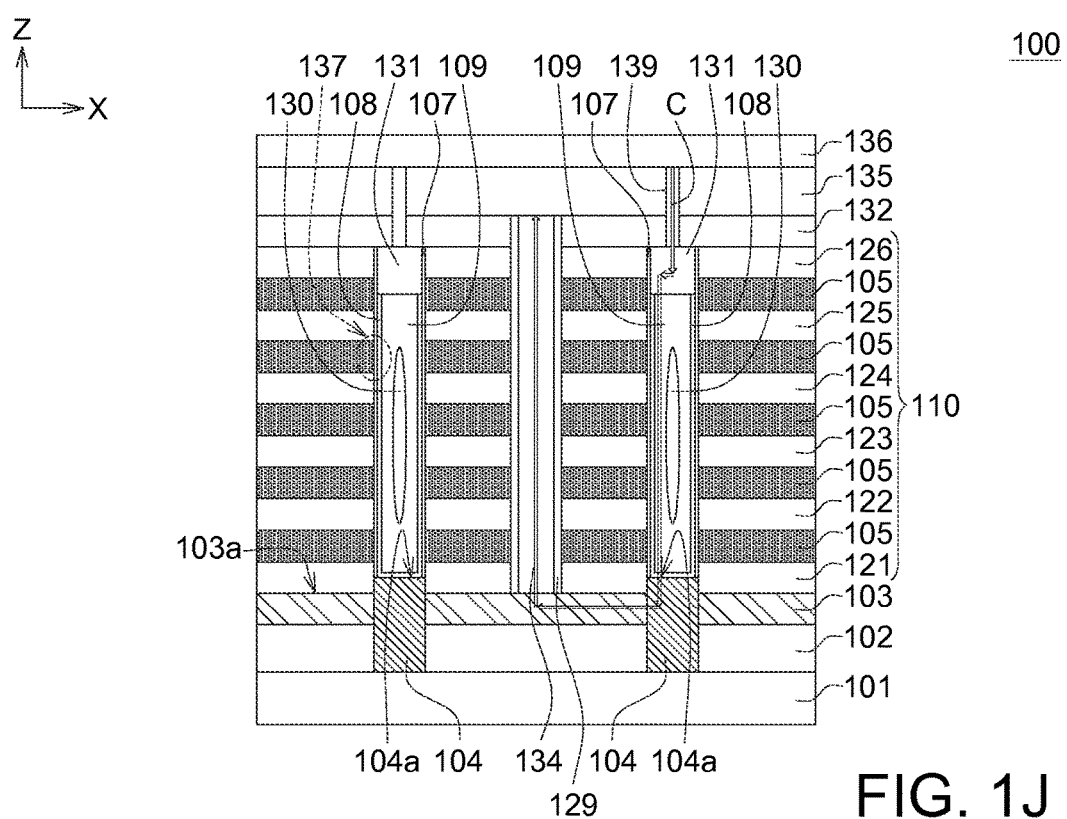

An inter-layer dielectric (ILD) 135 is then formed on the protection layer 132; a plurality of bit lines 136 electrically connected to the bond pad 131 with an interconnection via 139 are formed on the ILD 135. Subsequently, after a series of BEOL processes (not shown) are carried out, the memory device 100 as shown in FIG. 1J can be accomplished. In some embodiments of the present invention, the first conductive layer 103 can serve as the bottom common source line of the memory device 100; and the memory cells 137 defined by the second conductive layers 105, the memory layer 107 and the channel layer 108 of the memory cell array can be electrically coupled to a decoder, such as a row decoder or a column decoder (not shown), through the bit lines 136.

The current C coming from the bit lines 136 can flow to the earth by passing through the channel layer 108, the contact plug, the first conductive layer 103 (serving as the bottom common source line) and the metal plug 134. In other words, the current path C for performing the read/ program operation does not flow through the semiconductor substrate 101. The current path C for performing the read/ program operation can be shorter than that of the prior art memory device, the operation resistance and power consumption of the memory device 100 can be reduced. In addition, since there is no doped region with p-n junction and parasitic junction capacitance formed between layer 103 and substrate 101, thus the problems of signal interference due to the parasitic junction capacitance formed in the bottom common source and substrate line can be avoided, and the operation reliability and device speed of the memory device can be improved.

Figure 2A:
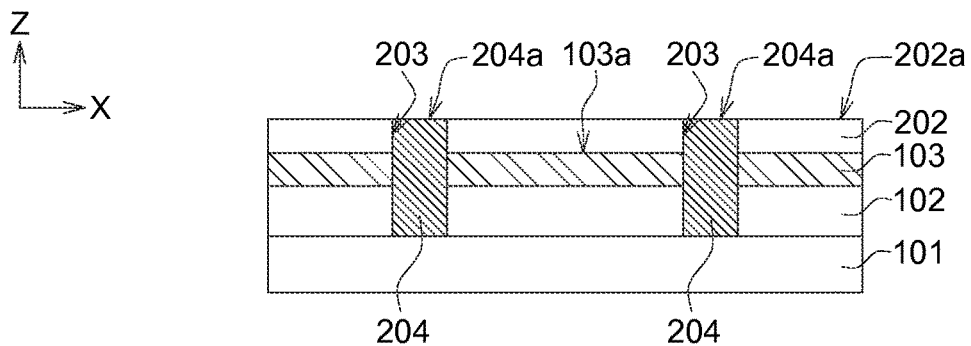
FIGS. 2A to 2G are cross-sectional views illustrating the processing structures for forming a memory device in accordance with another embodiment of the present invention.
Figure 2B:
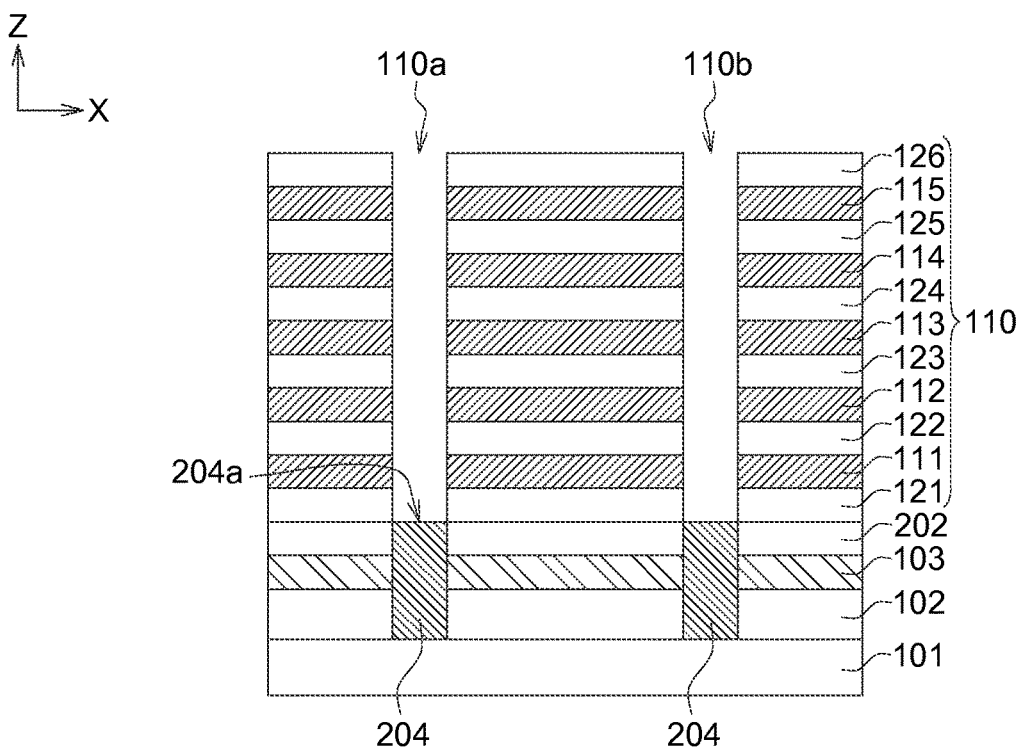

FIGS. 2A to 2G are cross-sectional views illustrating the processing structures for forming a memory device 200 in accordance with another embodiment of the present invention. In the present embodiment, the memory device 200 is also a vertical channel flash memory device. The method for fabricating the memory device 200 includes steps as follows:

Firstly, a first isolation layer 102, a first conductive layer 103 and a second isolation layer 202 are formed in sequence on a semiconductor substrate 101 (see FIG. 2A). A plurality of contact openings 203 passing through the second isolation layer 202, the first conductive layer 103 and the first isolation layer 102 is than formed to expose a portion of the semiconductor substrate 101. Next, a plurality of contact plugs 204 are respectively formed in the contact openings 203 to electrically contact the semiconductor substrate 101 with the first conductive layer 103 (see FIG. 2A).

In some embodiments of the present invention, the forming of the contact plugs 204 includes steps as follows: An etching process is performed to remove portions of the second isolation layer 202, the first conductive layer 103 and the first isolation layer 102, so as to form the contact openings 203. A conductive material, such as poly-silicon, is then formed on the second isolation layer 202 to fill the contact openings 203 by a deposition process, such as a LPCVD. Next, a planarization process, such as a chemical mechanical polish (CMP), using the second isolation layer 202 as a stop layer is performed to remove portions of the conductive material disposed on the second isolation layer 202, so as to form the contact plugs 204. In other words, each of the contact plugs 204 has a top surface 204a substantially higher than the top surface 103a of the first conductive layer 103 and substantially conformal with the top surface 202a of the second isolation layer 202.

Subsequently, a multilayers stack 110 having a plurality of insulating layers 121-126 and a plurality of sacrificing layers 111-115 is provided on the second isolation layer 202. An etching process is then performed to form a plurality of first through openings 110a and 110b passing through the multilayers stack 110, so as to expose a portions of the contact plugs 204 (see FIG. 2B). In order to ensure that each of the first through openings 110a and 110b can align with the corresponding contact plug 204, each of the contact plugs 204 preferably has a cross section substantially greater than that of the corresponding first through opening 110a or 110b to enlarge the process windows of the etching process for forming the first through openings 110a and 110b.

Figure 2C:
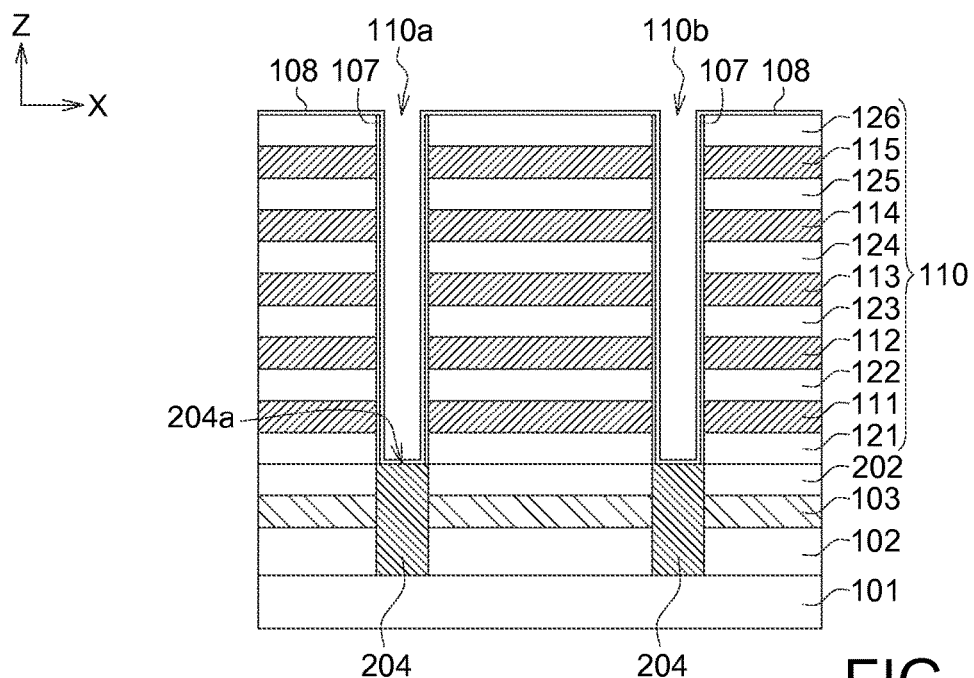
Figure 2D:
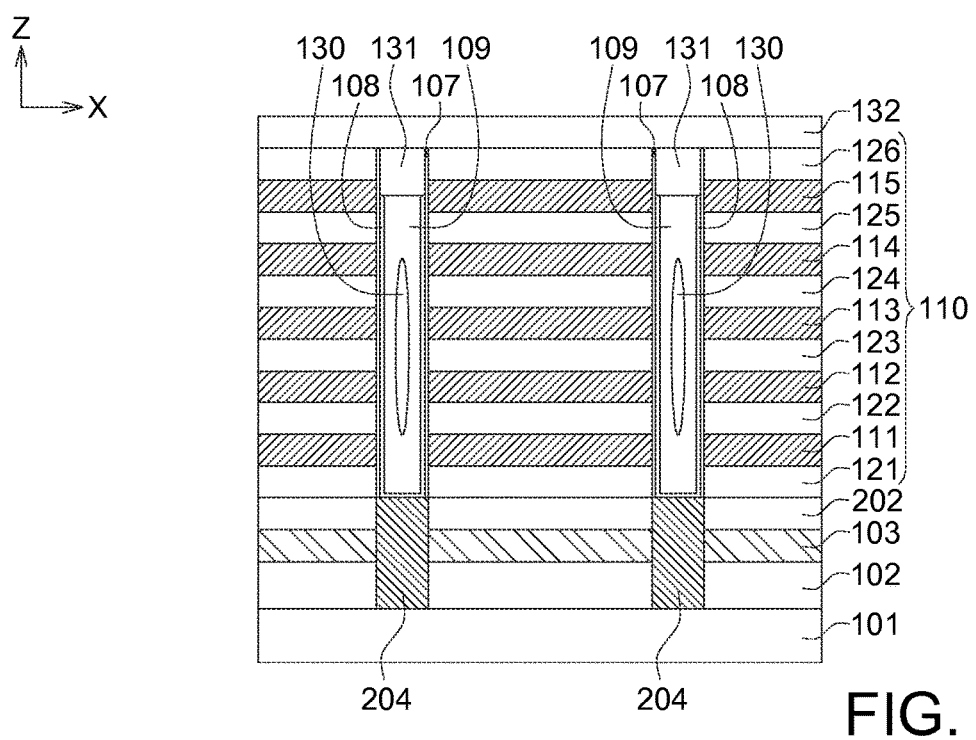

Next, a memory layer 107 and a channel layer 108 are formed in sequence on sidewalls of the first through opening 110a and 110b to make the memory layer 107 disposed between the channel layer 108 and the remaining sacrificing layers 111-115 and make the channel layer 108 electrically in contact with the contact plugs 204 (see FIG. 2C).

Thereafter, the first through openings 110a and 110b are filled by a dielectric material 109, such as silicon dioxide ($SiO_2$), and at least one air gap 130 is formed in the filled first through openings 110a and 110b. After the dielectric material 109 is etched back, a bond pad 131 may be formed on the dielectric material 109 to form an electrical contact with the channel layer 108, and a clapping layer 132 is then provide to cover the bond pad 131 and the multilayers stack 110 (see FIG. 2D).

Figure 2E:
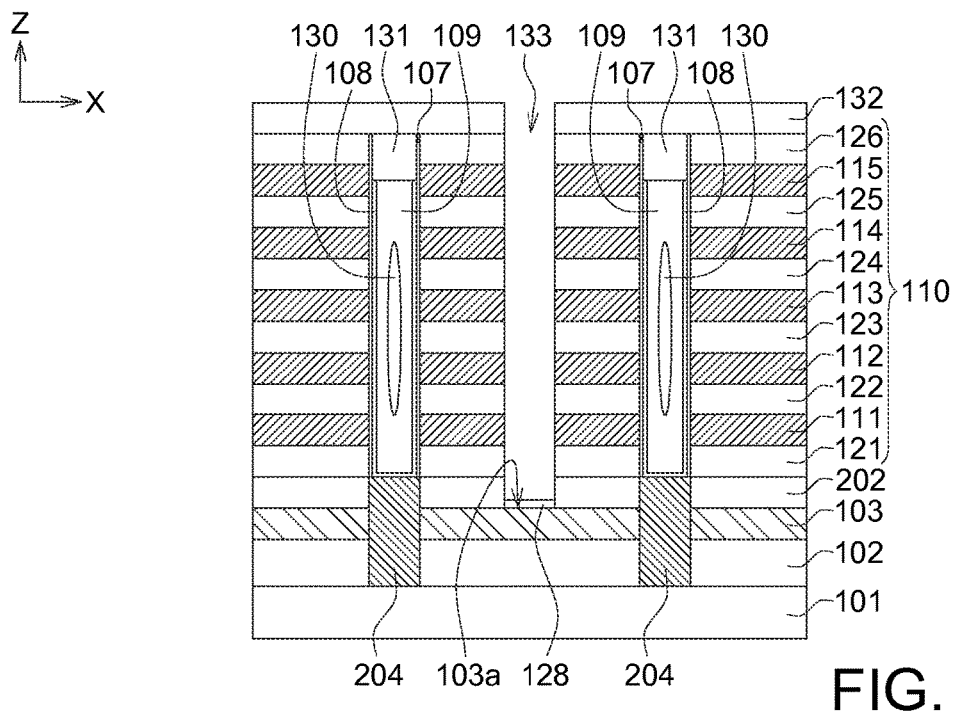
Figure 2F:
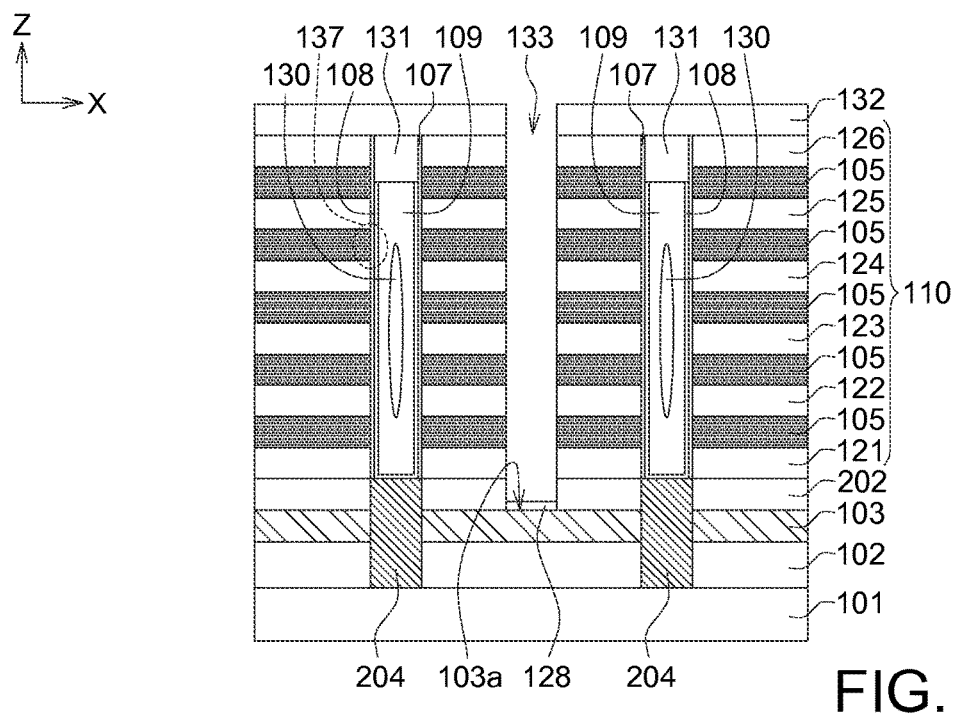

Subsequently, another etching process is performed to form at least one second through opening 133 passing through the multilayers stack 110 and the second isolation layer 202 along the Z axle from the top surface of the multilayers stack 110, so as to partially expose the sacrificing layers 111-115, the insulating layers 121-126 and the top surface 103a of the first conductive layer 103 (see FIG. 2E). In some embodiments of the present embodiments, a protection layer 128 made by an oxidation process performed on the top surface 103a of the first conductive layer 103 may be provided to protect the first conductive layer 103 in the following process steps.

The remaining sacrificing layers 111-115 is then removed to expose the portions of the memory layer 107. Next, a plurality of second conductive layers 105 are formed on the positions where the remaining sacrificing layers 111-115 initially occupied. As a result, a plurality memory cells 137 can be defined at the points of intersection between the second conductive layers 105, the memory layer 107 and the channel layer 108 to form a memory cell array in the multilayers stack 110 (see FIG. 2F).

Figure 2G:
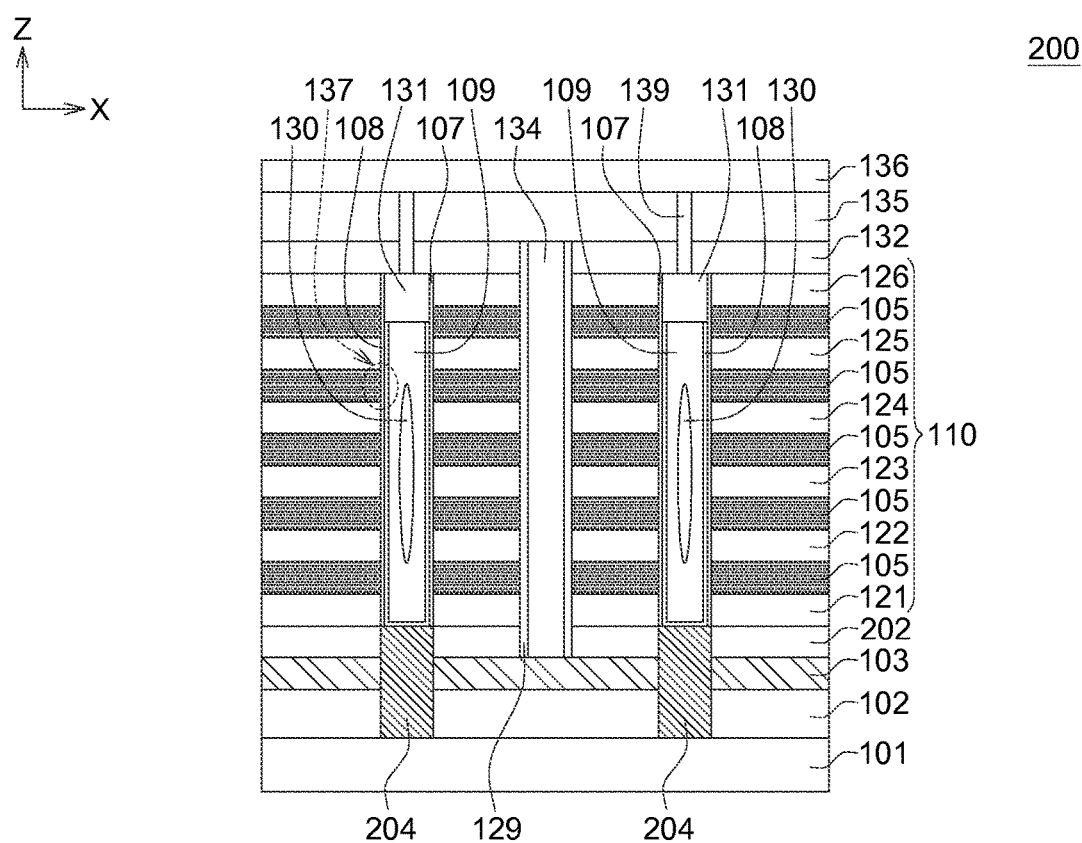

After the forming of the second conductive layers 105, a dielectric spacer 129 and a metal plug 134 are then formed in the second through opening 133, to make the metal plug 134 electrically in contact with the first conductive layer 103 and electrically insulated from the second conductive layers 105 by the dielectric spacer 129. An inter-layer dielectric (ILD) 135 is then formed on the protection layer 132; a plurality of bit lines 136 electrically connected to the bond pad 131 with an interconnection via 139 are formed on the ILD 135. Subsequently, after a series of BEOL processes (not shown) are carried out, the memory device 100 as shown in FIG. 2G can be accomplished.

Of note that, in some embodiments of the present embodiment, the memory device can be a vertical channel floating gate NAND flash memory device. For example, FIGS. 3A to 3G are cross-sectional views illustrating the processing structures for forming a vertical channel floating gate NAND flash memory device 300 in accordance with yet another embodiment of the present invention. In the present embodiment, the method for fabricating the vertical channel floating gate NAND flash memory device 300 is similar to that for fabricating the memory device 100 depicted in FIGS. 1A to 1J, except the process for forming the memory layer 307. Since the material and method for forming the other components are described in the embodiments of FIGS. 1A to 1J, thus the identical process may not redundantly described.

In the present embodiment, the process for forming the memory layer 307 follows the steps depicted in FIG. 1C. After the forming of the contact plugs 104 a protection layer 301 is formed on each top surface 104a of the contact plugs 104. A pull-back etching process is then performed to remove portions of the sacrificing layers 111-115 to form a plurality of first recesses 302 between the insulating layers 121-127. In the present embodiment, the pull-back etching process is wet etching process using $H_3PO_4$ solution to remove portions of the sacrificing layers 111-116 embedded in an interlayer space defined by two adjacent insulating layers 121-127 through the first through openings 110a and 110b. In other words, each of the first recesses 302 is a space defined by one of the remaining sacrificing layer 111-116 disposed in the interlayer space defined by corresponding two adjacent insulating layers 121-127 and the two adjacent insulating layers 121-127 (see FIG. 3A).

An oxidation process is then performed to oxidize the exposed portions of the remaining sacrificing layers 111-116, so as to form a plurality of spacing layers 303 in the first recesses 302. In other words, the spacing layers 303 are formed on the vertical sidewalls of the first recesses 302. In the present embodiment, the oxidation process includes an in-situ-steam-generation (ISSG) oxidation process which can respectively transform silicon nitride of the remaining sacrificing layer 111-115 into silicon oxide to form the spacing layers 303 (see FIG. 3B).

Figure 3A:
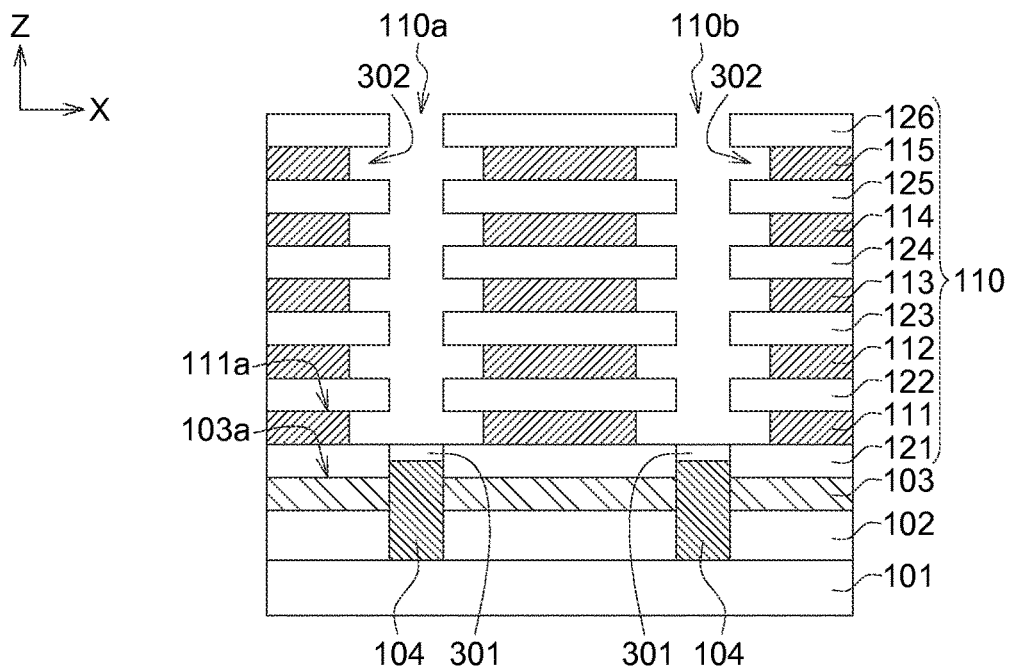
FIGS. 3A to 3G are cross-sectional views illustrating the processing structures for forming a vertical channel floating gate NAND flash memory device in accordance with yet another embodiment of the present invention.
Figure 3B:
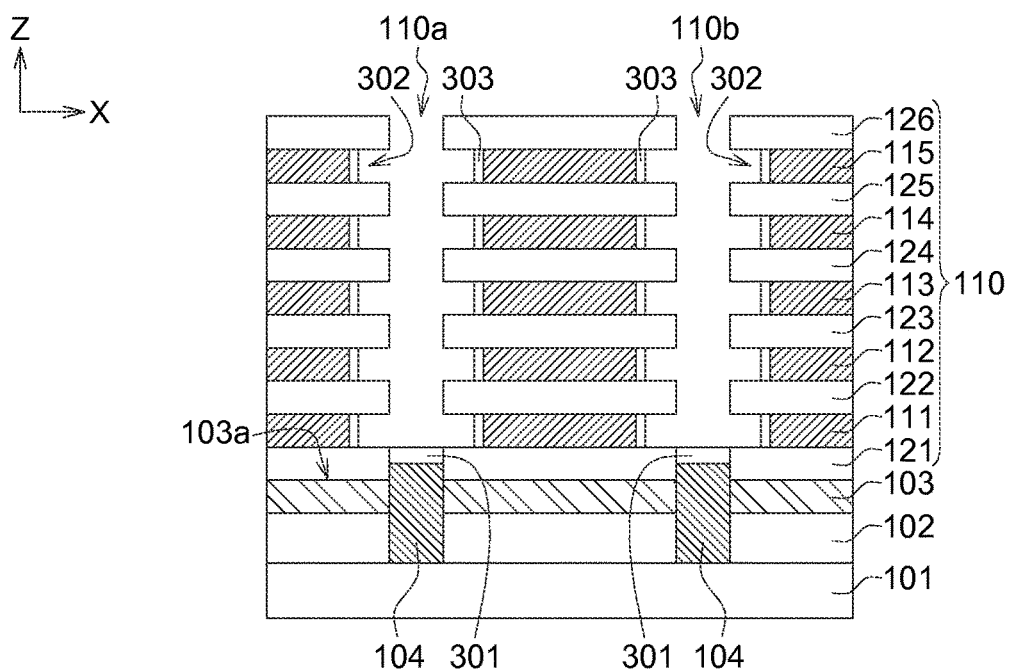
Figure 3C:
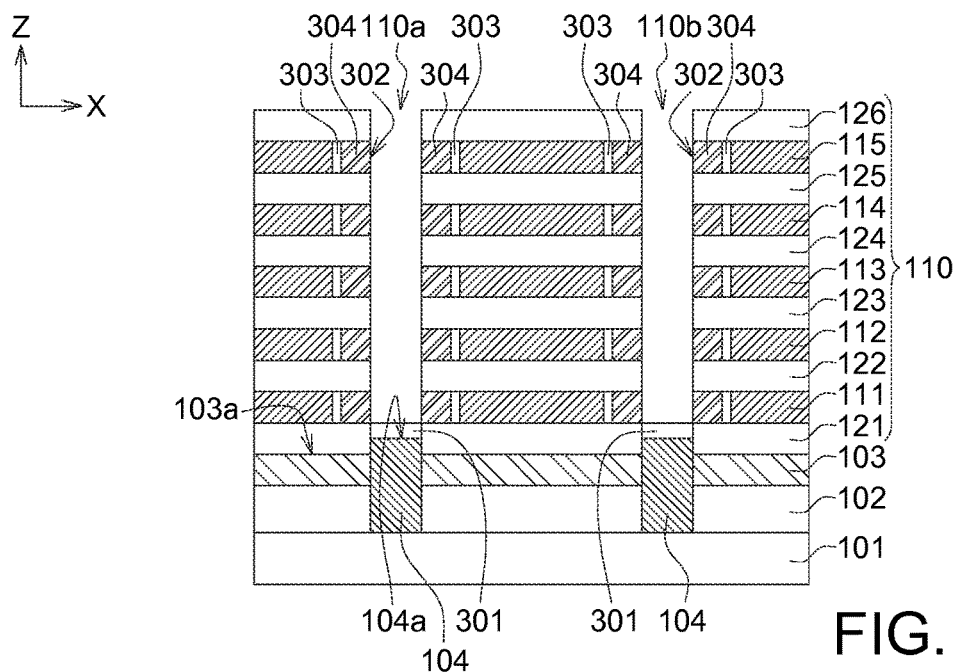
Figure 3D:
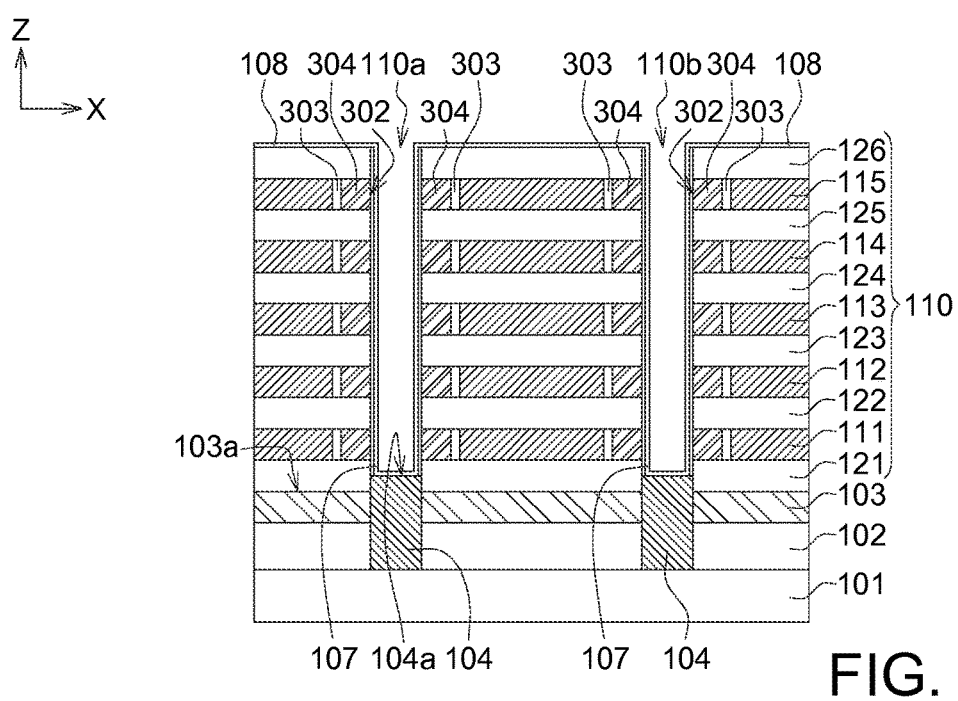
Figure 3E:
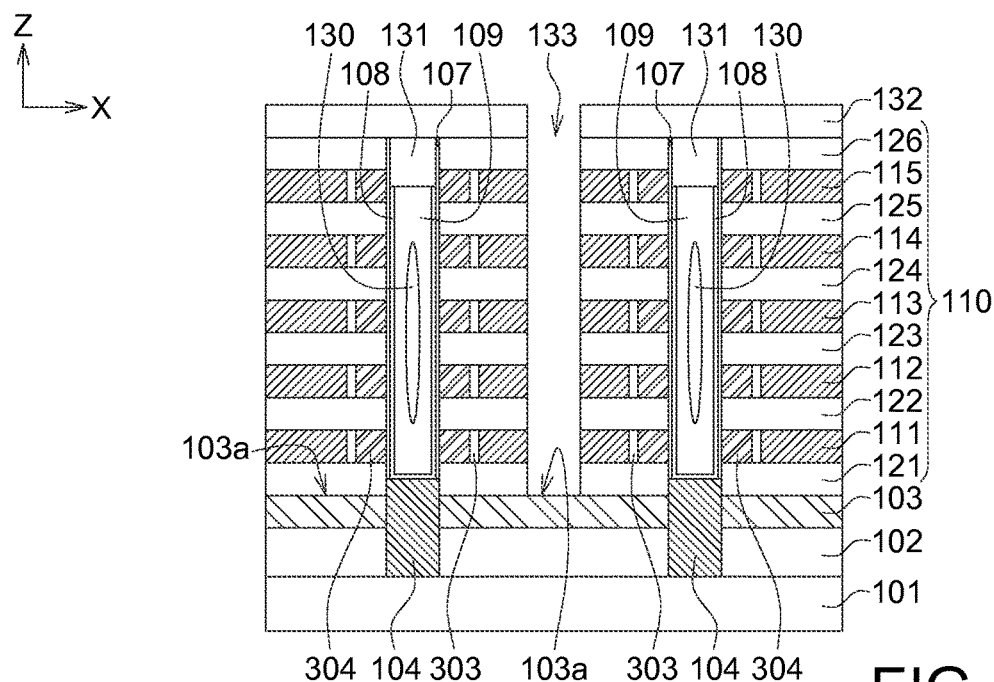
Figure 3F:
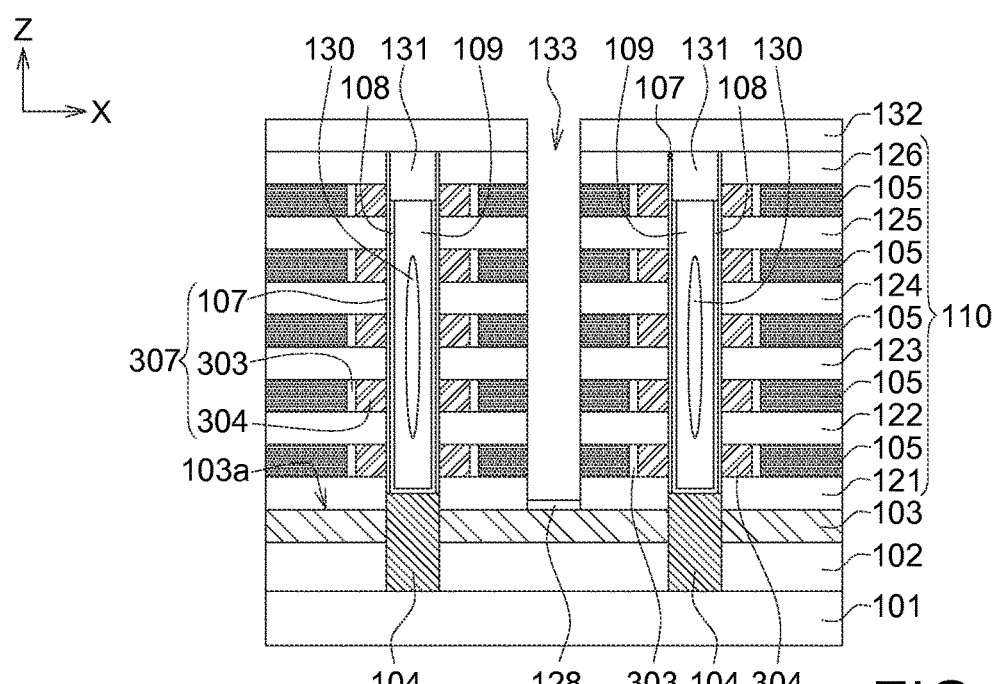

Subsequently, a plurality of floating gate electrodes 304 are formed to respectively fill the first recesses 302 (see FIG. 3C). The forming of the floating gate electrodes 304 includes steps as follows: A deposition process, such as a LPCVD process, is firstly performed to form a conductive layer on the multilayers stack 110 and filling the trenches 110a and 110b as well as the first recesses 302. Another pull-back etching process is then performed to remove the portions of the conductive layer that are both disposed on the multilayers stack 110 and in the first through openings 110a and 110b; and mere the portions of the conductive layer disposed in the first recesses 302 are remained, whereby a plurality of floating gate electrodes 304 are formed in the first recesses 302. In the present embodiment, the floating gate electrodes 106 may be made of poly-silicon, silicide or metal, such as aluminum (Al), copper (Cu), gold (Au), silver (Ag), Platinum (Pt) or the alloys thereof.

After the floating gate electrodes 304 are formed, a tunneling oxide layer 305 is formed by a deposition process to blanket over portions of the insulating layers 121-127 and the floating gate electrodes 304 exposed from the first through openings 110a and 110b. A channel layer 108 is then formed to conformally blanket over the tunneling oxide layer 305 and the top surface 104a of the contact plugs 104 exposed from the first through openings 110a and 110b (see FIG. 3D).

In some embodiments of the present invention, the forming of the tunneling oxide layer 107 includes steps as follows: A silicon oxide layer is first formed by a deposition process, such as LPCVD process, to conformally blanket over the multilayers stack 110 and the sidewalls and bottom of the first through opening 110a and 110b. An etching process is then performed to remove portions of the silicon oxide layer disposed on the top surface of the multilayers stack 110 and the bottom of the first through opening 110a and 110b, so as to form the tunneling oxide layer 107. In some embodiments, the protection layer 301 preferably can be removed by the same etching process, so as to expose the top surface 104a of the contact plugs 104. the forming of the channel layer 108 includes steps of depositing a poly-silicon layer to blanket over the sidewalls and bottom of the first through opening 110a and 110b and bottom of the first through opening 110a and 110b, so as to make the tunneling oxide layer 107 layer disposed between the channel layer 108 and the floating gate electrodes 304 and make the channel layer 108 electrically in contact with the contact plugs 104.

After the forming of the channel layer 108, the first through openings 110a and 110b are filled by a dielectric material 109, such as $SiO_2$, and at least one air gap 130 is formed in the filled first through openings 110a and 110b. After the dielectric material 109 is etched back, a bond pad 131 may be formed on the dielectric material 109 to form an electrical contact with the channel layer 108, and a clapping layer 132 is then provide to cover the bond pad 131 and the multilayers stack 110. Subsequently, another etching process is performed to form at least one second through opening 133 passing through the multilayers stack 110 along the Z axle from the top surface of the multilayers stack 110, so as to partially expose the sacrificing layers 111-115, the insulating layers 121-126 and the top surface 103a of the first conductive layer 103 (see FIG. 3E).

The remaining sacrificing layers 111-115 is then removed through the second through opening 133, so as to expose the portions of the memory layer 107. Next, a plurality of second conductive layers 105 are formed on the positions where the remaining sacrificing layers 111-115 initially occupied. As a result, a plurality of vertical channel floating gate memory cells 306 can be defined at the points of intersection between the second conductive layers 105, the spacing layers 303, the floating gate electrodes 304, the memory layer 107 and the channel layer 108, so as to form a vertical channel floating gate memory cell array in the multilayers stack 110 (see FIG. 3F). In the present embodiment, each of the second conductive layers 105 may serve as the control gate electrode of the corresponding vertical channel floating gate memory cell 306; and the combination of one of the spacing layers 303, the corresponding one of the floating gate electrodes 304 and the tunneling oxide layer 107 can be referred to as a memory layer of the vertical channel floating gate memory cell 306, wherein the spacing layers 303 can serve as the inter-poly dielectric (IPD) layer disposed between the control gate electrode (the second conductive layers 105) and the floating gate electrodes 304.

Figure 3G:
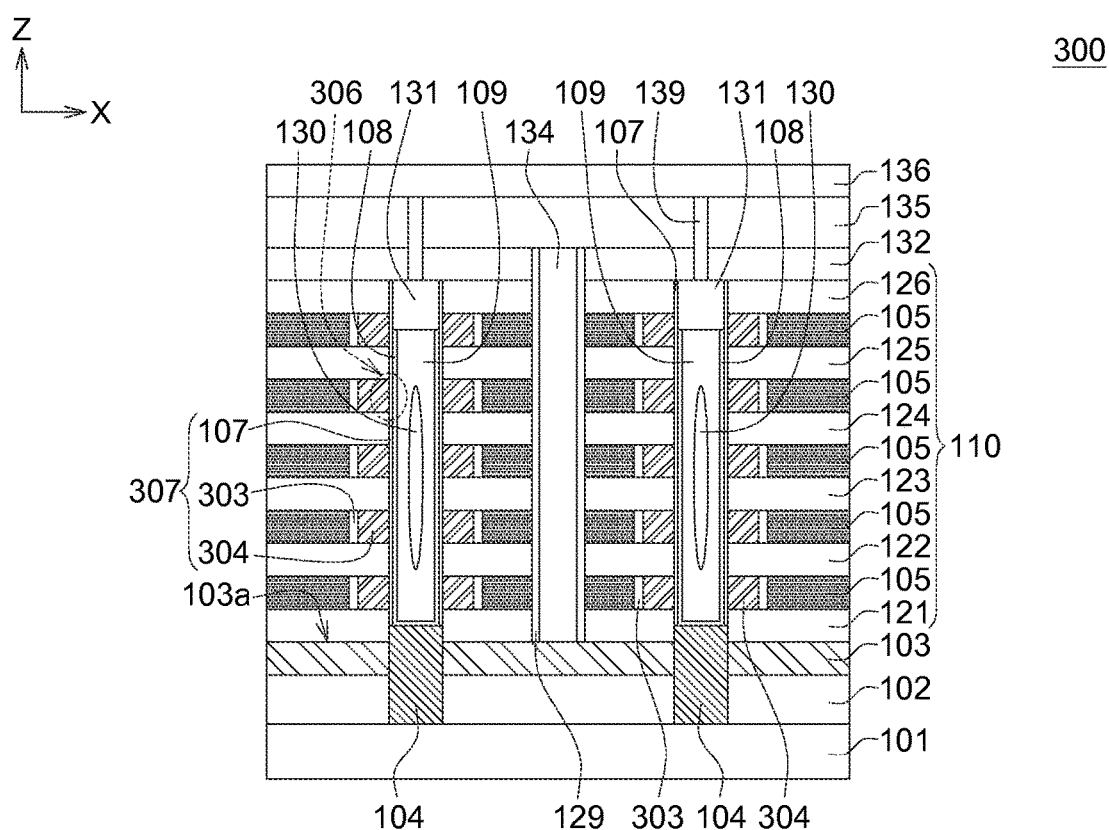

An ILD 135 is then formed on the protection layer 132; a plurality of bit lines 136 electrically connected to the bond pad 131 with an interconnection via 139 are formed on the ILD 135. Subsequently, after a series of BEOL processes (not shown) are carried out, the vertical channel floating gate NAND flash memory device 300 as shown in FIG. 3G can be accomplished.

In accordance with the aforementioned embodiments of the present invention, a memory device and method for fabricating the same are provided, wherein an isolation layer, a conductive layer and a multilayers stack having a plurality of memory cells defined therein are formed in sequence on a semiconductor substrate; at least one contact plug passing through the isolation layer and the conductive layer is formed to electrically contact the semiconductor substrate with the conductive layer; and a plurality of channel layers vertically passing through the multilayers stack and electrically in contact with the corresponding contact plugs are then provided to electrically connect the memory cells to form a plurality of memory cell strings. Wherein the distance between the conductive layer and the channel layer is substantially shorter than the distance between the semiconductor substrate and the channel layer.

Because the memory device provided by the embodiments of the present invention applies the independent conductive layer to serve as the bottom common source line, instead of using the semiconductor substrate to serve as the bottom common source line, as the prior art memory device does. The path of current for performing the read/program operation of the present memory device passing through the conductive layer is shorter than that of the prior art memory device passing through the semiconductor substrate, the operation resistance of the present memory device can be thus significantly reduced. In addition, since there is no doped region with different conductivities formed in the conductive layer of the present memory device, thus the problems of signal interference due to the parasitic junction capacitance formed in the bottom common source line and substrate can be avoided, and the operation reliability and device speed of the memory device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a semiconductor substrate;
   a dielectric isolation layer, disposed on the semiconductor substrate;
   a first conductive layer, disposed on the isolation layer;
   a contact plug, passing through the isolation layer and electrically contacting the semiconductor substrate with the first conductive layer;
   a plurality insulating layers, disposed on the first conductive layer;
   a plurality of second conductive layers, alternatively stacked the insulating layers and insulated from the first conductive layer;
   a channel layer, disposed on at least one sidewall of at least one first through opening and electrically contact to the contact plug, wherein the first through opening passes through the insulating layers the second conductive layers, so as to expose the contact plug; and
   a memory layer, disposed between the channel layer and the second conductive layers, wherein the memory layer comprises:
   a tunnel oxide layer, disposed between the channel layer and the second conductor layers;
   a plurality of floating gate electrodes, respectively disposed between each of the second conductor layers and the tunnel oxide layer; and
   a plurality of spacing layers, respectively disposed between each of the second conductor layers and the corresponding one of the floating gate electrodes.

2. The memory device according to claim 1, wherein the memory layer comprises an oxide-nitride-oxide (ONO) structure disposed on the sidewall of the first through opening and between the second conductor layers and the channel layer.

3. The memory device according to claim 1, further comprising:
   a dielectric spacer disposed on the sidewall of a second through opening, wherein the second through opening passes through the insulating layers the second conductive layers, so as to expose the first conductive layer; and
   a metal plug, disposed in the second through opening, electrically in contact with the first conductive layer and electrically insulated from the second conductive layers by the dielectric spacer.

4. The memory device according to claim 1, wherein the contact plug has a top surface substantially higher than a top surface of the first conductive layer.

5. The memory device according to claim 1, further comprising:
   a dielectric material filled into the first through opening in which at least one air gap is formed;
   a bond pad disposed on the dielectric material; and
   a clapping layer covering the bond pad.

6. A method for fabricating a memory device, comprising:
   forming an insulation layer on a semiconductor substrate;
   forming a first conductive layer on the isolation layer;
   providing a multilayers stack having a plurality of insulating layers and a plurality of sacrificing layers stacked with each other on the first conductive layer, to make the first conductive layer isolated from the sacrificing layers;
   forming at least one first through opening passing through the multilayers stack, the first conductive layer and the isolation layer to partially expose the semiconductor substrate the insulating layers and the sacrificing layers;
   performing a selective deposition to form a contact plug at the bottom of the first through opening, so as to make the contact plug electrically contacting the semiconductor substrate with the first conductive layer;
   removing portions of the sacrificing layers to form a plurality of first recesses between the insulating layers;
   oxidizing exposed portions of the remaining sacrificing layers, so as to form a plurality of spacing layers in the first recesses;
   forming a plurality of floating gate electrodes to respectively fill the first recesses;
   forming a tunneling oxide layer to blanket over portions of the insulating layers and the floating gate electrodes exposed from the first through opening;
   forming a memory layer and a channel layer in sequence on at least one sidewall of the first through opening to make the memory layer disposed between the channel layer and the remaining sacrificing layers and make the channel layer electrically in contact with the contact plug;
   forming at least one second through opening passing through the multilayers stack to partially expose the first conductive layer, the insulating layers and the remaining sacrificing layers
   removing the remaining sacrificing layers through the second through opening; and
   forming a plurality of second conductive layers on positions where the remaining sacrificing layers initially occupied.

7. The method according to claim 6, wherein the forming of the memory layer comprises steps of forming an ONO structure on the sidewall of the first through opening.

8. The method according to claim 6, further comprising:
   forming a protection layer on a exposed surface of the first conductive layer prior to removing the remaining sacrificing layers;
   removing the protection layer, after the forming of the second conductive layers
   forming a dielectric spacer on at least one sidewall of the second through opening; and
   forming a metal plug in the second through opening to make the metal plug electrically in contact with the first conductive layer and electrically insulated from the second conductive layers by the dielectric spacer.

9. The method according to claim 6, further comprising:
   filling a dielectric material into the first through opening, so as to form at least one air gap therein;
   forming at least one bond pad on the dielectric material; and
   forming a clapping layer to cover the bond pad.

10. A method for fabricating a memory device, comprising:
- forming a first insulation layer, a first conductive layer and a second isolation layer in sequence on a semiconductor substrate;
- forming at least one contact opening passing through the second isolation layer, the first conductive layer and the first isolation layer to expose a portion of the semiconductor substrate;
- forming a contact plug in the contact opening to electrically contact the semiconductor substrate with the first conductive layer;
- providing a multilayers stack having a plurality of insulating layers and a plurality of sacrificing layers stacked with each other on the second isolation layer;
- forming at least one first through opening passing through the multilayers stack to partially expose the contact plug, the insulating layers and the sacrificing layers;
- forming a memory layer and a channel layer in sequence on at least one sidewall of the first through opening to make the memory layer disposed between the channel and the remaining sacrificing layers and make the channel layer electrically in contact with the contact plug;
- forming at least one second through opening passing through the multilayers stack and the second isolation layer to partially expose the first conductive layer, the insulating layers and the remaining sacrificing layers;
- forming a protection layer on a exposed surface of the first conductive layer;
- removing the remaining sacrificing layers through the second through opening;
- forming a plurality of second conductive layers on positions wherein the remaining sacrificing layers initially occupied;
- removing the protection layer;
- forming a dielectric spacer on at least one sidewall of the second through opening; and
- forming a metal plug in the second through opening to make the metal plug electrically in contact with the first conductive layer and electrically insulated from the second conductive layers by the dielectric spacer.

11. The method according to claim 10, wherein the forming of the memory layer comprises:
- removing portions of the sacrificing layers to form a plurality of first recesses between the insulating layers;
- oxidizing exposed portions of the remaining sacrificing layers, so as to form a plurality of spacing layers in the first recesses;
- forming a plurality of floating gate electrodes to respectively fill the first recesses; and
- forming a tunneling oxide layer to blanket over portions of the insulating layers and the floating gate electrodes exposed from the first through opening.

12. The method according to claim 10, wherein the forming of the memory layer comprises steps of forming an ONO structure on the sidewall of the first through opening.

13. The method according to claim 10, further comprising:
- filling a dielectric material into the first through opening, so as to form at least one air gap therein;
- forming at least one bond pad on the dielectric material; and
- forming a clapping layer to cover the bond pad.

14. The method according to claim 10, wherein the contact plug has a size substantially greater than that of the first through opening.

* * * * *